United States Patent
Ceballos et al.

(10) Patent No.: US 11,750,960 B2
(45) Date of Patent: Sep. 5, 2023

(54) SHOCK RECOVERY FOR SILICON MICROPHONE SYSTEMS

(71) Applicant: Infineon Technologies AG, Neubiberg (DE)

(72) Inventors: Jose Luis Ceballos, Villach (AT); Hong Chen, Villach (AT); Fulvio Ciciotti, Villach (IT); Andreas Wiesbauer, Poertschach (AT); Bernhard Wotruba, Munich (DE)

(73) Assignee: Infineon Technologies AG, Neubiberg (DE)

( * ) Notice: Subject to any disclaimer, the term of this patent is extended or adjusted under 35 U.S.C. 154(b) by 93 days.

(21) Appl. No.: 17/451,562

(22) Filed: Oct. 20, 2021

(65) Prior Publication Data

US 2023/0121912 A1    Apr. 20, 2023

(51) Int. Cl.
*H04R 3/00* (2006.01)
*H04R 29/00* (2006.01)
*H04R 1/08* (2006.01)
*H03F 3/183* (2006.01)

(52) U.S. Cl.
CPC .............. *H04R 1/08* (2013.01); *H03F 3/183* (2013.01); *H03F 2200/03* (2013.01); *H04R 3/00* (2013.01); *H04R 29/00* (2013.01)

(58) Field of Classification Search
CPC . H04R 1/04; H04R 1/08; H04R 25/30; H04R 25/305; H04R 29/00; H04R 29/004; H04R 2201/003; H03R 3/00; H03R 3/007; H03F 3/181; H03F 3/183
See application file for complete search history.

(56) References Cited

U.S. PATENT DOCUMENTS

| | | | |
|---|---|---|---|
| 8,179,626 B1* | 5/2012 | Ryan | G11B 5/5582 360/60 |
| 8,401,208 B2* | 3/2013 | Ceballos | H04R 3/007 381/122 |
| 9,942,677 B2* | 4/2018 | Wiesbauer | H04R 29/004 |
| 2007/0236252 A1* | 10/2007 | Matsumoto | H03K 19/0005 326/81 |
| 2009/0121778 A1* | 5/2009 | Ceballos | H04R 3/007 327/530 |
| 2011/0142261 A1 | 6/2011 | Josefsson | |
| 2014/0037112 A1 | 2/2014 | Lee et al. | |
| 2015/0110295 A1* | 4/2015 | Jenkner | H04R 3/00 381/114 |
| 2015/0110296 A1 | 4/2015 | Jenkner et al. | |

FOREIGN PATENT DOCUMENTS

JP    2007096897 A    4/2007

* cited by examiner

*Primary Examiner* — Thang V Tran
(74) *Attorney, Agent, or Firm* — Slater Matsil, LLP (57) ABSTRACT

A microphone includes an amplifier coupled to an input node of the microphone; a shock detector coupled to the input node of the microphone; and a recovery circuit having an input coupled to an output of the shock detector, and an output coupled to the input of the microphone.

19 Claims, 10 Drawing Sheets

SHOCK RECOVERY FOR SILICON MICROPHONE SYSTEMS

TECHNICAL FIELD

The present invention relates generally to a system of shock recovery for silicon microphone systems and a corresponding method.

BACKGROUND

Numerous circuits and devices use digital microphones for sensing acoustic information such as speech, music, and other acoustic waves generated from mechanical vibration, noise or even a single pulse of sound such as a "bang." Non-limiting examples of such devices include smartphones, computers, and sensors, as well as many other devices. One general class of digital microphones utilizes a capacitive membrane. When electrically biased by way of appropriate circuitry, a time-varying electrical charge is present across the capacitive element in accordance with incident acoustic energy. Thus, a capacitive microphone provides an electrical signal representative of the sound energy detected by the digital microphone.

Capacitive microphones can exhibit a long recovery time when subjected to a "big signal" event, or shock, that may occur when the digital microphone is bumped by a solid object, is subjected to an unusually loud sound, or subjected to other such events. The long recovery time is due to the high impedance biasing circuitry of the digital microphone. Capacitive-type digital microphones and the associated biasing circuitry define an appreciably long time constant (i.e., tau), that can be on the order of tens of seconds. A corresponding period of important acoustic information (e.g., speech) can go undetected by the microphone while the capacitive element is slowly re-biased to normal operating signal levels. The slow recovery of capacitive-type digital microphones subjected to shock events may impact performance in some applications.

In particular, therefore, infrasound signals (low frequency with high energy) can often shift the operating point (OP) in digital microphone systems. High-impedance node drift (having huge time constants) in the biasing circuitry makes this drift condition last several seconds, losing performance over very long periods of time.

SUMMARY

According to an embodiment, a microphone includes an amplifier coupled to an input node of the microphone; a shock detector coupled to the input node of the microphone; and a recovery circuit having an input coupled to an output of the shock detector, and an output coupled to the input of the microphone.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

Embodiments of the present invention comprise a digital microphone including a shock detector and a recovery circuit for rapidly restoring a normal bias level and operating conditions to the digital microphone after a shock is received. When the shock arrives a set of comparators in the shock detector detects the shock and generates an output signal that enables a time-controlled algorithm generated by the recovery circuit. In embodiments, the time-controlled algorithm can comprise a sequence of increasing data states that form a digital word. The digital word commands a digital-to-analog DAC, which generates a voltage signal that controls a control node of a transistor switch. The controlled transistor switch is coupled to the input node of the digital capacitor, which rapidly adjusts the voltage of the input node and reduces the biasing impedance to speed-up the recovery time. The input node voltage is adjusted from a shocked bias level to a normal bias level. Normal operation of the digital microphone is advantageously restored more quickly after the shocked condition is removed, when compared to prior art digital microphones.

In embodiments, the operating point of the sensitive high-impedance input modes of a digital microphone are reset in a timely manner after a shock is received via an analog-to-digital converter (ADC)/DAC control loop. In embodiments, the shock detector and recovery circuit advantageously use Digital-Signal-Processing (DSP) and can also reuse portions of existing digital microphone start-up circuitry. After the shock condition is removed, the biasing level of the digital microphone rapidly returns to a "high-performance" value needed for proper operation according to embodiments. Specific embodiments of a digital microphone including a shock detector and a recovery circuit for restoring proper operation are described in further detail below.

Figure 1:
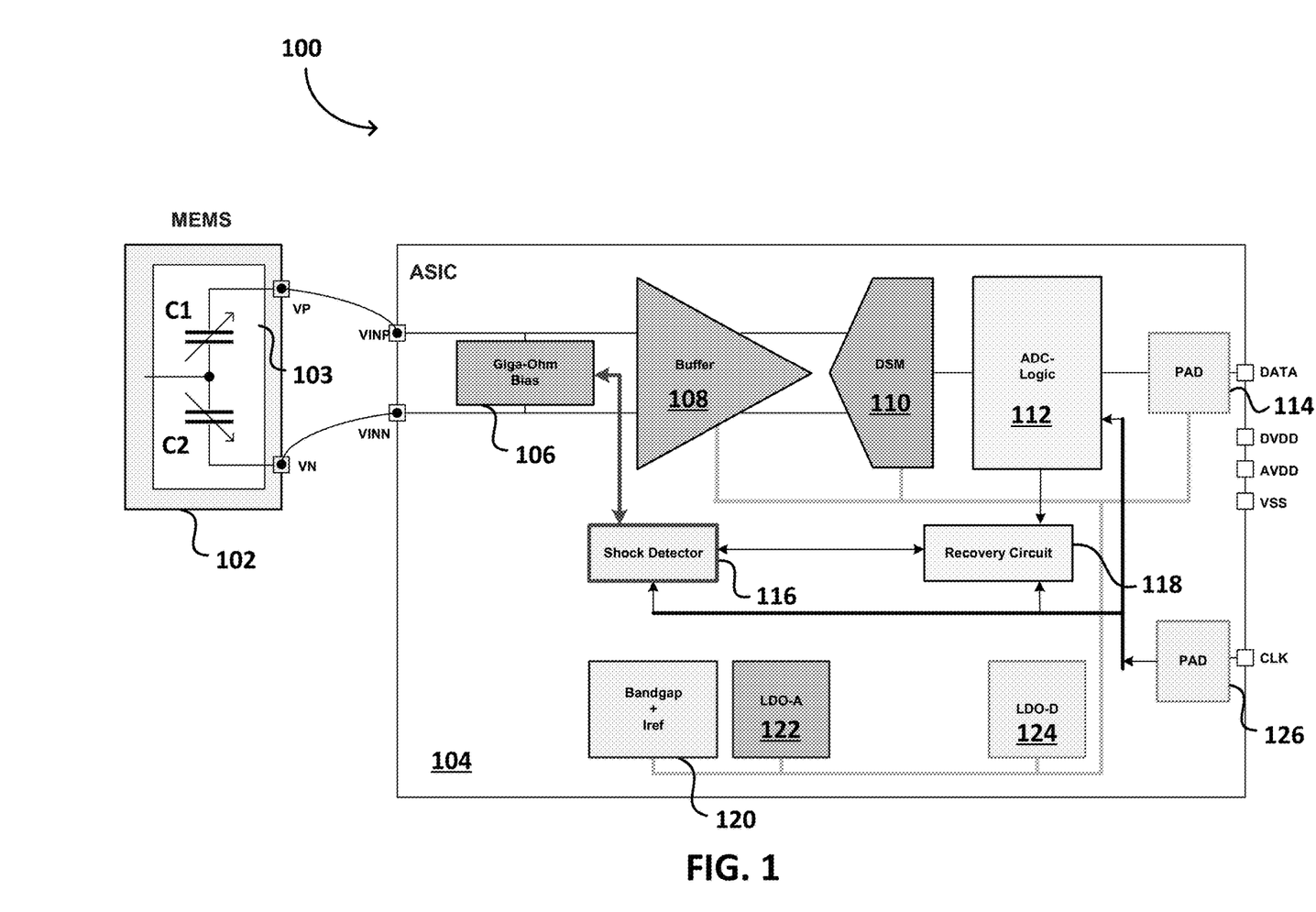
FIG. 1 is a block diagram of a digital microphone including a shock detector and recovery circuit, according to an embodiment.

FIG. 1 is a block diagram of a digital microphone 100 including a shock detector 116 and a recovery circuit 118, according to an embodiment. Digital microphone 100 includes a MEMS device 102 for converting sound waves and vibrations in a single or differential analog voltage. In embodiments, MEMS device 102 can include a capacitive portion 103, including a first variable capacitor C1 and a second variable capacitor C2. Capacitors C1 and C2 represent the capacitance of the MEMS device that changes in response to sound waves or vibrations. In embodiments the capacitive portion 103 can be fabricated in silicon and includes one or more membranes and one or more backplates for generating analog output voltages at output pins VP and VN in response to the received sound waves. Digital microphone 100 also includes an application-specific integrated circuit (ASIC) 104 including input pins (input nodes) VINP and VINN respectively coupled to the VP and VN output pins of MEMS device 102. High ohmic biasing circuitry 106 (Giga-Ohm Bias) is coupled to input pins VINP and VINN. The first variable capacitor C1 and second variable capacitor C2 are thus coupled to the high ohmic biasing circuitry 106, which causes the input nodes of digital microphone 100 to have a long time constant, which can be measured in seconds. Input nodes VINP and VINN are also coupled to inputs of an amplifier 108, which can be a unity gain buffer amplifier or a programmable gain amplifier, in an embodiment. The outputs of amplifier 108 are coupled to inputs of an ADC 110, which in an embodiment can be a Delta-Sigma Modulation (DSM) ADC. The output of ADC 110 is coupled to ADC logic circuitry 112, which can include filtering, control, and interface circuitry, as well as other DSP components in embodiments. The output of ADC logic circuitry 112 may include a one-bit serial output data stream that is available on pad 114 coupled to the output DATA pin of ASIC 104.

ASIC 104 also includes a shock detector 116 coupled to high ohmic biasing circuitry 106, and a recovery circuit 118. Shock detector 116 and recovery circuit 118 can receive a clock signal from pad 126 coupled to the CLK pin of ASIC 104. In some embodiments, shock detector 116 can comprise clocked comparators instead or continuous time comparators. In some embodiments, start-up timing constraints and other requirements may require that shock detector 116 receive a clock signal. In some embodiments, recovery circuit 118 includes at least a counter and a state machine, as well as one or more other components. In other embodiments, recovery circuit 118 includes a counter, a state machine, a digital-to-analog converter (DAC), and a switch coupled to the input of the digital microphone. In other embodiments, recovery circuit 118 includes a voltage-controlled resistance coupled to the input of the digital microphone. Shock detector 116 and recovery circuit 118 are described in further detail below. In some embodiments, ASIC 104 may include a bandgap circuit 120 (which in some embodiments also includes a reference current (Iref) generator), a low dropout voltage regulator (LDO-A) 122 coupled to various analog components of ASIC 104, and a low dropout voltage regulator (LDO-D) 124 coupled to various digital components of ASIC 104. Power supply pins DVDD (digital supply voltage), AVDD (analog supply voltage), and VSS (negative supply voltage) are also shown in FIG. 1 for supplying power to ASIC 104. While a block diagram of a digital microphone 100 including a shock detector 116 and a recovery circuit 118 and other associated components is shown in FIG. 1, it will be appreciated by those skilled in the art that other components can be added or removed in some specific embodiments, other power supply and signal pins can be added or removed, and that other connections can be added or removed in some specific embodiments. While a differential digital microphone 100 is shown in FIG. 1, a single-ended digital microphone can also be used in embodiments. In some embodiments MEMS device 102 and ASIC 104 are separate integrated circuits that are assembled in a single semiconductor package. In other embodiments MEMS device 102 and ASIC 104 are fabricated on a common semiconductor or other substrate in a single integrated circuit. ASIC 104 can also be fabricated in one or more components, including hardware circuits and digital components that are implemented in a microprocessor.

Figure 2:
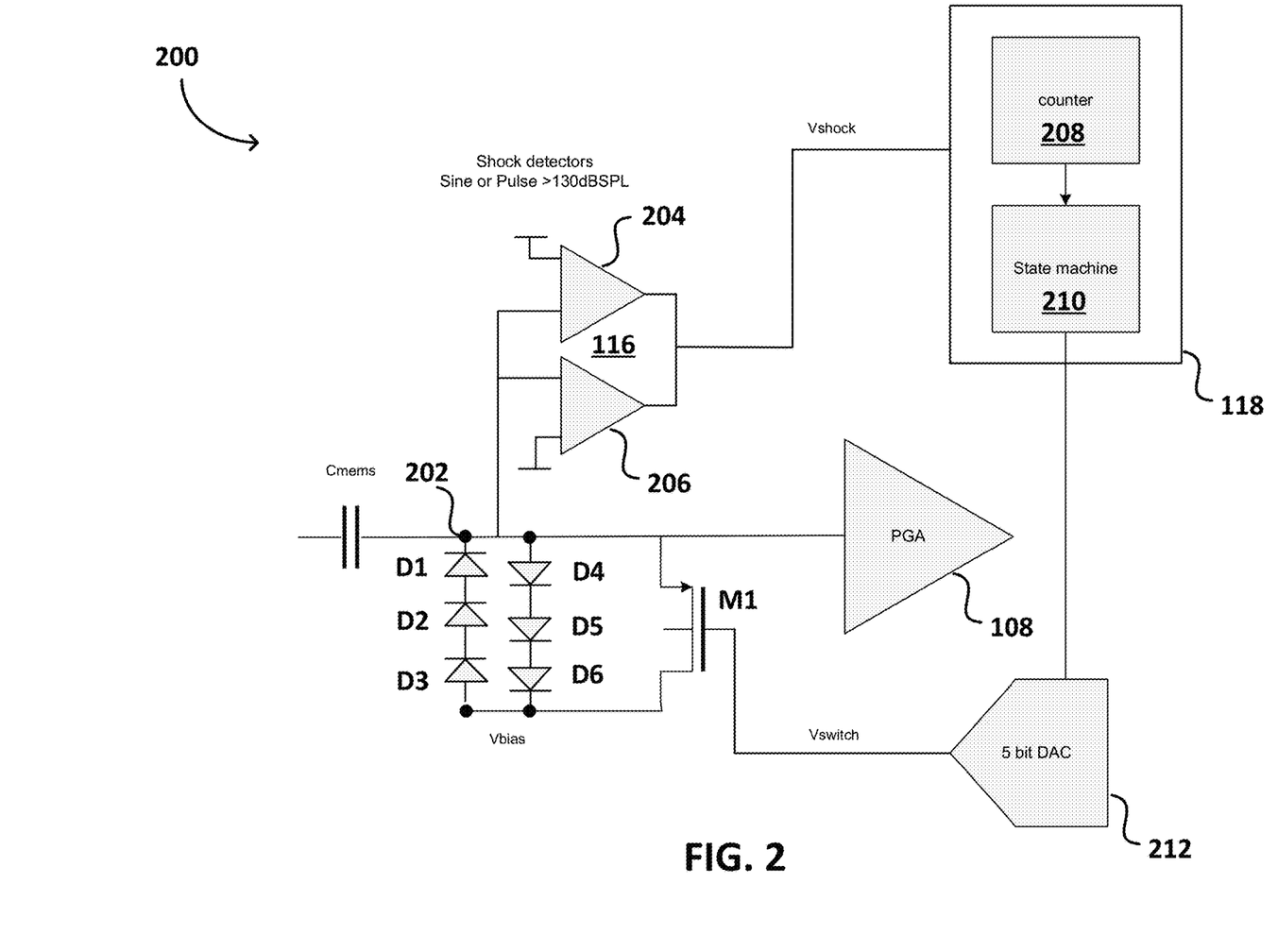
FIG. 2 is a block diagram of a shock detector and recovery circuit, according to an embodiment.

FIG. 2 is a block diagram of a digital microphone 200 including a shock detector 116 and recovery circuit 118; other components of a digital microphone are also shown for context, and described in further detail below. For example, the capacitance of the MEMS device is represented by a single capacitor $C_{MEMS}$, and the biasing circuitry is represented by diodes D1, D2, D3, D4, D5, and D6, all coupled to input node 202. The anode of diode $D_3$ and the cathode of diode D6 are coupled to biasing node $V_{BIAS}$. In some embodiments, diodes D1, D2, D3, D4, D5 and D6 can comprise MOS transistors that are biased in an off mode of operation with appropriate biasing circuitry to form very high value giga-ohm biasing resistors. Amplifier 108 has an input coupled to input node 202 and is shown as a programmable gain amplifier (PGA). The remaining digital microphone components previously shown in FIG. 1 are omitted for clarity.

FIG. 2 includes a shock detector 116 coupled to input node 202 including a first comparator 204 having a first threshold and a second comparator 206 having a second threshold, in an embodiment. Additional comparators and thresholds can be used, in an embodiment. In some embodiments the thresholds can be actively adjusted during the recovery of the normal biasing level.

Shock detector 116 generates an output signal V SHOCK that changes its data state once a shock condition is detected, and changes its data state back to the original data state once the shock condition is removed. Shock detector 116 can be considered an ADC, since the voltage at input node 202 is an analog signal, and the output signal $V_{SHOCK}$ is a digital output signal. A recovery circuit 118 is coupled to an output of the shock detector 116. In an embodiment, the recovery circuit 118 comprises a counter 208 and a state machine 210 coupled to an output of the counter 208. A digital-to-analog converter (DAC) 212 is coupled to an output of the recovery circuit 118. In an embodiment, DAC 212 is a five bit DAC, although other DAC configurations can be used in an embodiment. The digital output word of recovery circuit 118 is converted into an analog control voltage designated $V_{SWITCH}$ by the digital-to-analog conversion of DAC 212. A switch M1, such as an MOS transistor in an embodiment, has a control node (gate) coupled to an output of DAC 212 for receiving the $V_{SWITCH}$ analog control voltage, and a controlled node (source) coupled to the input node 202, wherein the controlled node (source) of the switch M1 is configured for gradually reducing the impedance between the input node and the biasing node after a change in a bias level of the input node is detected, and wherein the control node (gate) of the switch M1 is configured for receiving a plurality of sequentially increased voltage steps. Switch M1 can comprise a MOS transistor in an embodiment. As shown, switch M1 is coupled between the input node 202 and the bias voltage source for generating the $V_{BIAS}$ voltage. The time and voltage increments/decrements of the voltage steps can be individually adjusted in embodiments. As will be explained in further detail below the voltage steps applied to the gate of switch M1 are configured to have a range between a shocked bias level during a shock event and a normal bias level when the normal bias level is rapidly restored.

Figure 3:
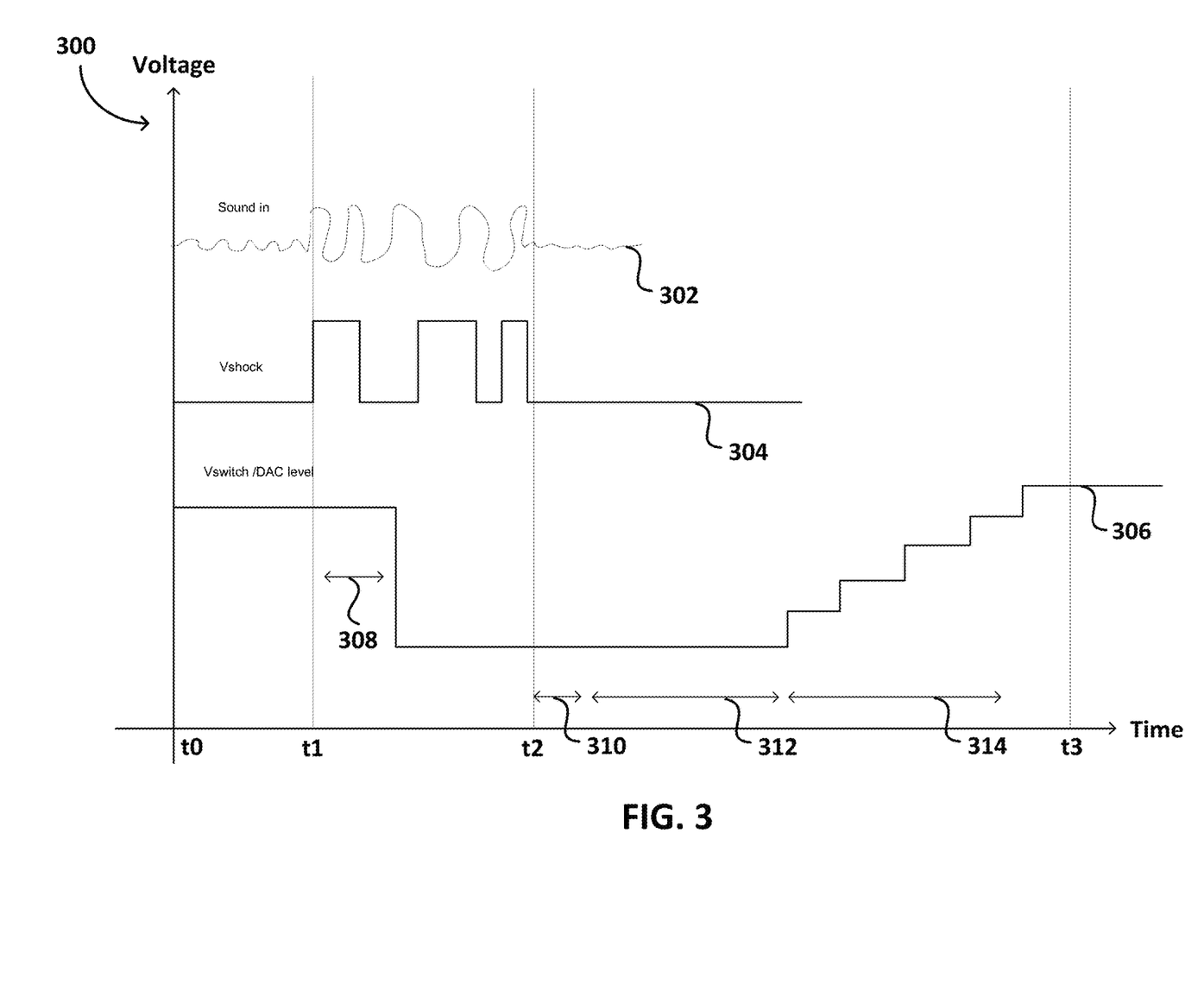
FIG. 3 is a timing diagram associated with the shock detector and recovery circuit of FIG. 2.

FIG. 3 is a timing diagram 300 associated with the shock detector and recovery circuit of FIG. 2. In timing diagram 300, the horizontal axis (X-axis) represents time and the vertical axis (Y-axis) represents voltage. Waveform 302 (Sound In) represents the analog voltage on the input of the shock detector, wherein a normal input waveform (relatively low level signal) is associated with a normal operating mode during time interval (t0, t1), wherein a shocked input waveform (relatively high level signal) is associated with one or more shock events during time interval (t1, t2), and wherein a normal input waveform (relatively low level signal) is associated with a normal operating mode after the shock events have ceased during time interval (t2, t3). Waveform 304 ($V_{SHOCK}$) represents the digital output voltage of the shock detector, wherein a normal output waveform ($V_{SHOCK}$ low) is associated with a normal operating mode during time interval (t0, t1), wherein a shocked input waveform (three pulses of varying durations, $V_{SHOCK}$ high) is associated with one or more shock events during time interval (t1, t2), and wherein a normal output waveform ($V_{SHOCK}$ low) is associated with a normal operating mode after the shock events have ceased during time interval (t2, t3). Waveform 306 represents the analog input voltage to the switch $V_{SWITCH}$ (or output level of the DAC) and is at a high voltage level during time interval (t0, t1) such that the switch is off, and the normal high ohmic bias resistance is maintained. In an embodiment, after a delay time interval 308, $V_{SWITCH}$ is set to a lower voltage level during time interval (t1, t2) such that the switch is turned on, and a low bias resistance is achieved. In an embodiment, after delay intervals 310 and 312, $V_{SWITCH}$ is ramped up from the low voltage level during the shock event, up to the original high voltage level to rapidly restore the original normal operating conditions. In an embodiment, the low voltage level corresponds to a DAC output level of 00xx. The DAC output is thus at a first level, which is represented as "00xx" and then increases to a higher level. Therefore, if $V_{SHOCK}$=1 for t>t_delay (time interval 308) then the recovery circuit is in a shocked state and the DAC level=00xx. In embodiments, the low ohmic bias resistance is ideally re-triggered immediately anytime a new shock is detected. If the recovery circuit is in a shocked state and $V_{SHOCK}$=0 for t>10 ms (time interval 310) then the DAC level=00xx for time interval 312. Subsequently the DAC level comprises a sequential ramp from 00xx to full-scale in time interval 314. The voltage and time increments (or decrements in some embodiments) of the steps in the sequential ramp can be changed as desired. The duration of time intervals 308, 310, 312, and 314 can also be changed as desired in embodiments. In some embodiments, delay time interval 308 can be eliminated.

Figure 4:
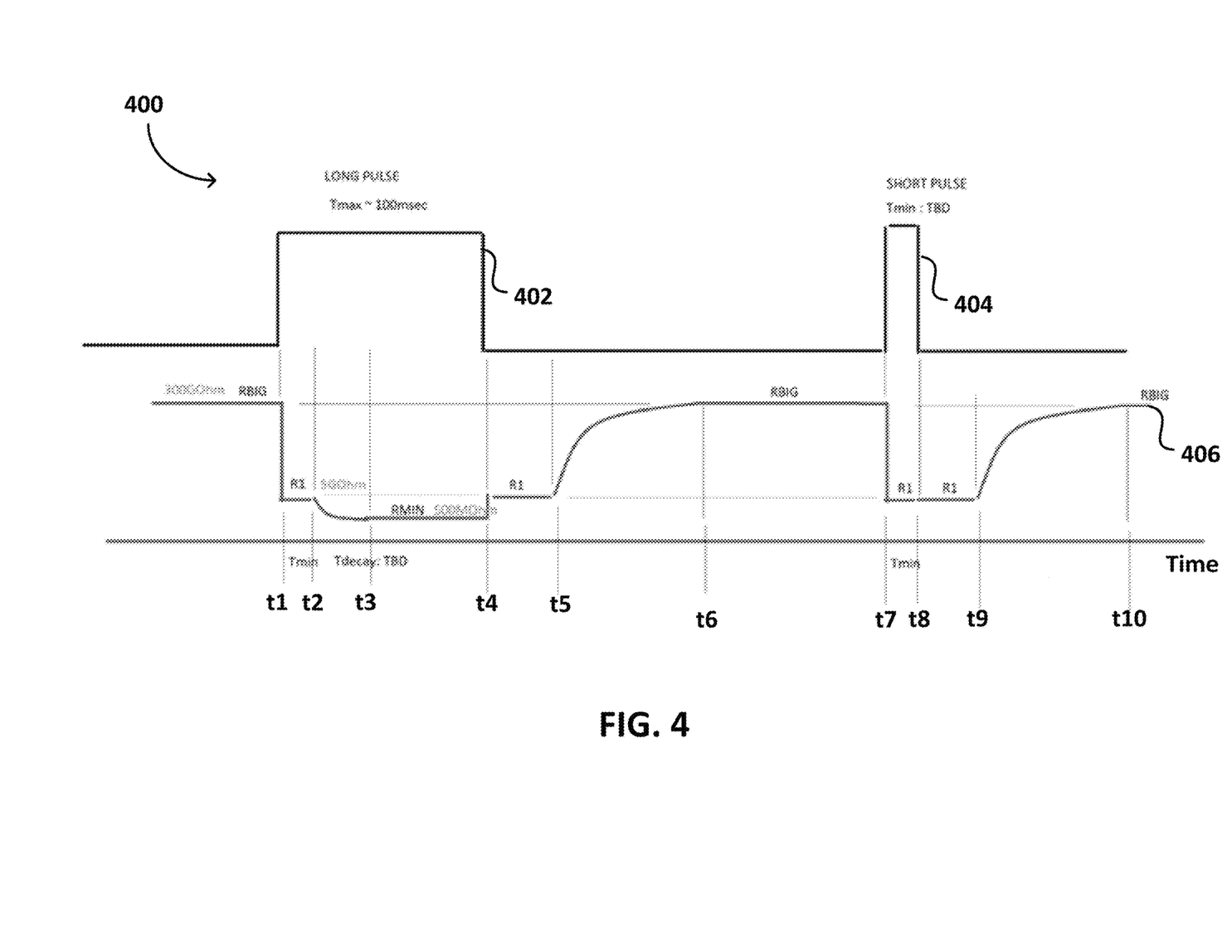
FIG. 4 is a timing diagram of the biasing impedance of the digital microphone of FIG. 1.

FIG. 4 is a timing diagram 400 of the biasing impedance of the digital microphone of FIG. 1 using the shock detector and recovery circuit, according to embodiments. The upper waveform shows a long duration shock pulse 402, and a short duration shock pulse 404. The minimum short pulse duration can vary depending on the shock detector used and the desired performance characteristics of the digital microphone. The lower waveform 406 represents the biasing impedance of the digital microphone. The long duration shock pulse 402 is high during time interval (t1, t4) and the short duration shock pulse 404 is high during time interval (t7, t8). Before time t1 the biasing impedance is very high ($R_{BIG}$), approximately three hundred GOhm in an embodiment. During minimum time interval $T_{MIN}$ (t1, t2), the biasing impedance is reduced to an intermediate low value (R1), approximately 5 GOhm in an embodiment. During time interval $T_{DECAY}$ (t2, t3) the biasing impedance is gradually reduced to a minimum low value ($R_{MIN}$), approximately five hundred MOhm in an embodiment. High ohmic biasing circuitry 106 can include different components such as clamping circuitry that may build up charge during long shock events. A further step down in the input impedance may therefore be required in some embodiments if the shock event lasts beyond a predetermined length because of the additional charge that builds up and the corresponding longer time recovery time. When the shock event pulse goes low, the normal biasing impedance value (R1, which ramps back to RBIG) is enough to recover the overload event in a desired time window. Both the $R_{MIN}$ and R1 biasing impedance values are controlled DAC 212. During time interval (t3, t4) the biasing impedance remains at the $R_{MIN}$ value. During the (t4, t5) time interval the R1 biasing impedance is restored. During the (t5, t6) time interval the original high value biasing impedance ($R_{BIG}$) is gradually restored as previously described. Normal operating conditions are restored during time interval (t6, t7) and the high value biasing impedance is maintained.

As is further shown in FIG. 4, a short duration shock pulse 404 is received and sensed during time interval (t7, t8). The short duration shock pulse 404 is of minimum duration ($T_{MIN}$) that can be responded to by the shock detector and recovery circuit, according to an embodiment. In other words, $T_{MIN}$ is the minimum disturbance that can be detected. Each time that the shock detector 116 including first comparators 204 and second comparator 206 toggles, state machine 210 brings ASIC 104 to the low ohmic state (beginning at time t1 or time t7), wherein the low ohmic state is maintained because of continuous re-triggering. During time interval (t7, t8) the biasing impedance is reduced to the R1 impedance value. Given the short duration of the time interval, the biasing impedance is not further reduced to the $R_{MIN}$ value. During a delay time interval (t8, t9) the R1 impedance value is maintained. During time interval (t9, t10) the original $R_{BIG}$ impedance value is gradually restored as previously described. After time t10, normal operating conditions and normal biasing impedance are maintained. The various time intervals and biasing impedance shown in FIG. 4 can be changed as desired to accommodate different applications.

Figure 5:
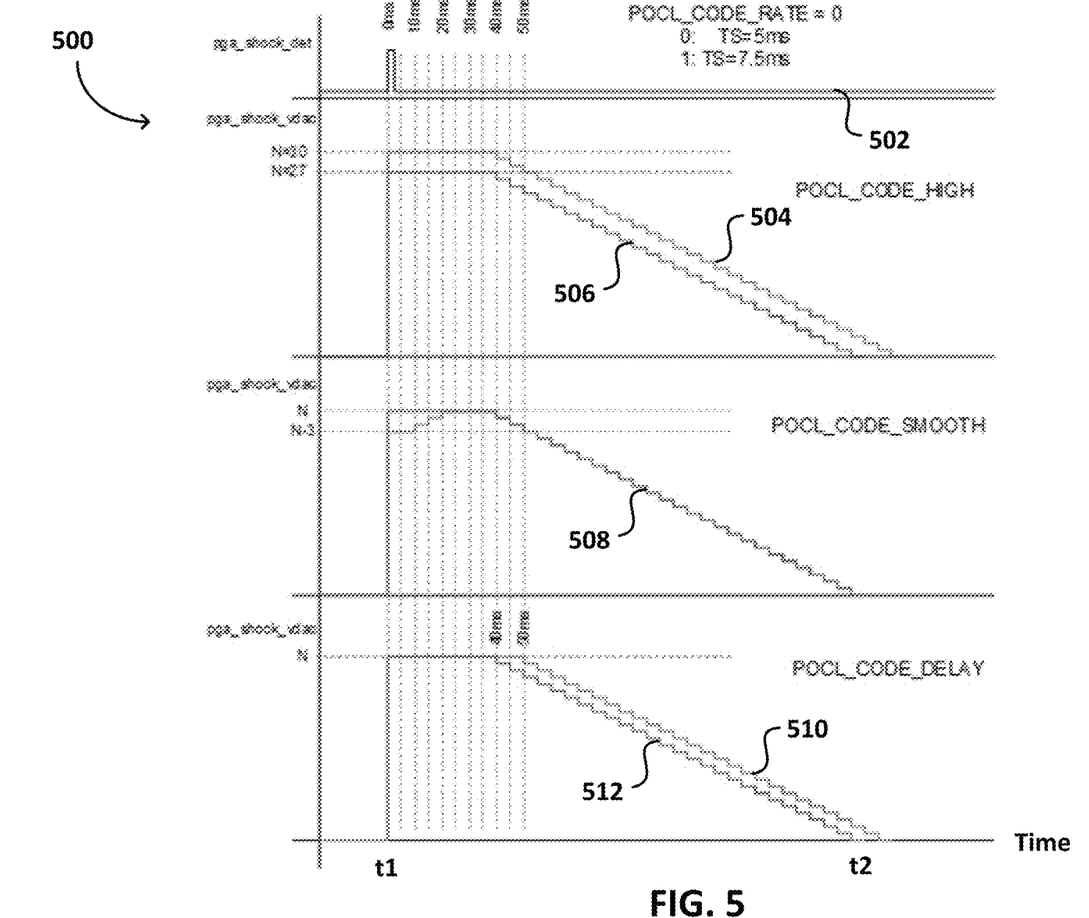
FIG. 5 is another timing diagram associated with the shock detector and recovery circuit of FIG. 2.

FIG. 5 is another timing diagram 500 associated with the shock detector and recovery circuit of FIG. 2, according to embodiments. In particular timing diagram 500 of FIG. 5 is specifically associated with programmable DAC features, wherein the DAC output follows pre-defined profiles generally occurring within a time interval (t1, t2) initiated by a shock detect pulse. Waveform 502 shows a shock detect pulse designated pga_shock_det, as well as three sets of DAC outputs designated pga_shock_vdac, described in further detail below. The shock detect pulse of waveform 502 is shown to be a single pulse, which initiates the DAC waveform. The programmable features include a peak DAC value, a risetime control, a length compensation, and a timestep adjustment. Assuming, in a specific embodiment, a five-bit DAC having a maximum number of distinguishable DAC outputs of $N=32(2^{\wedge}5)$, the peak DAC code can be selected between two values ($N=30$ and $N=27$) by means of a DAC register POCL_CODE_HIGH. In other embodiments, a DAC having fewer or more than five bits can be used and other peak DAC codes can also be used. The choice of $N=27$ and $N=30$ peak values correspond to two different possible values of the biasing impedance in the low-ohmic state, wherein $N=30$ is more low-ohmic than $N=27$. Choosing $N=30$ over $N=27$ is desired if the recovery to a shock event is not fast enough because of, for example, a larger than nominal biasing impedance value is required due to CMOS process variations. In other embodiments, additional peak values can be used for improved trimming of the biasing impedance value. The acronym "POCL" refers to the "PGA Overload Control Loop" shown in FIG. 2 comprising the shock detector 116, recovery circuit 118, DAC 212, and switch M1, all coupled to input node 202 (as well as programmable gain amplifier 108). The $N=30$ sequential DAC output is represented by waveform 504, and the $N=27$ sequential DAC output is represented by waveform 506. The risetime control can be changed from abrupt (initial portion of DAC waveform 508 set to a value of "N") to smoother (initial portion of DAC waveform 508 rising from a value of "N−3" to a value of "N" by means of a DAC register POCL_CODE_SMOOTH. The time compensation length can be selected between two predefined values (40 ms and 50 ms) by means of a DAC register POCL_CODE_DELAY. The minimum length DAC output is represented by waveform 512, and the maximum length DAC output is represented by waveform 510. The timestep of the code change can be changed between 5 ms and 7.5 ms according to a register POCL_CODE_RATE. The DAC registers are not specifically shown, but can be located, for example in the ADC-logic block 112 shown in FIG. 1. The various DAC output levels and time values shown in FIG. 5 are only examples and can be changed as desired to accommodate a variety of applications.

Figure 6:
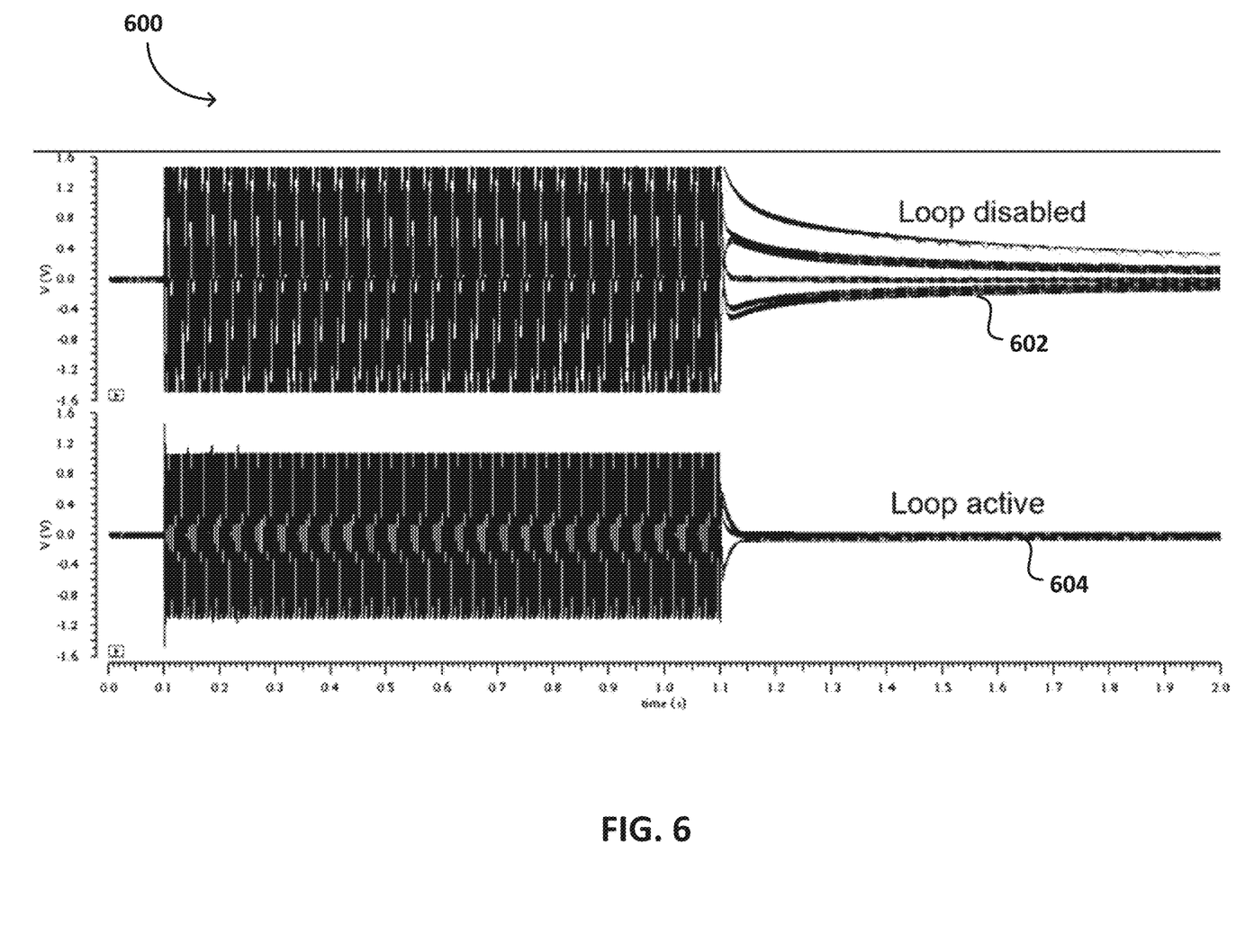
FIG. 6 is a timing diagram comparing the shock recovery characteristics of a digital microphone with and without the shock detector and recovery circuit, according to an embodiment.

FIG. 6 is a timing diagram comparing the shock recovery characteristics of a digital microphone with and without the shock detector and recovery circuit, according to an embodiment. Waveform 602 represents an input voltage of a prior art digital microphone having a long input time constant and no shock detector or recovery circuit. The shocked condition extends from about 0.1 seconds to 1.1 seconds, followed by a recovery period that lasts, in some instances, to a time greater than 2.0 seconds. Waveform 602 represents an input voltage of a digital microphone having a long input time constant but includes a shock detector and recovery circuit, according to an embodiment. The shocked condition also extends from about 0.1 seconds to 1.1 seconds, followed by a short recovery period that lasts, in all instances, to a time less than 1.15 seconds. Thus, the net recovery period is advantageously reduced from a time exceeding one or more seconds to a time less than 50 ms.

Figure 7:
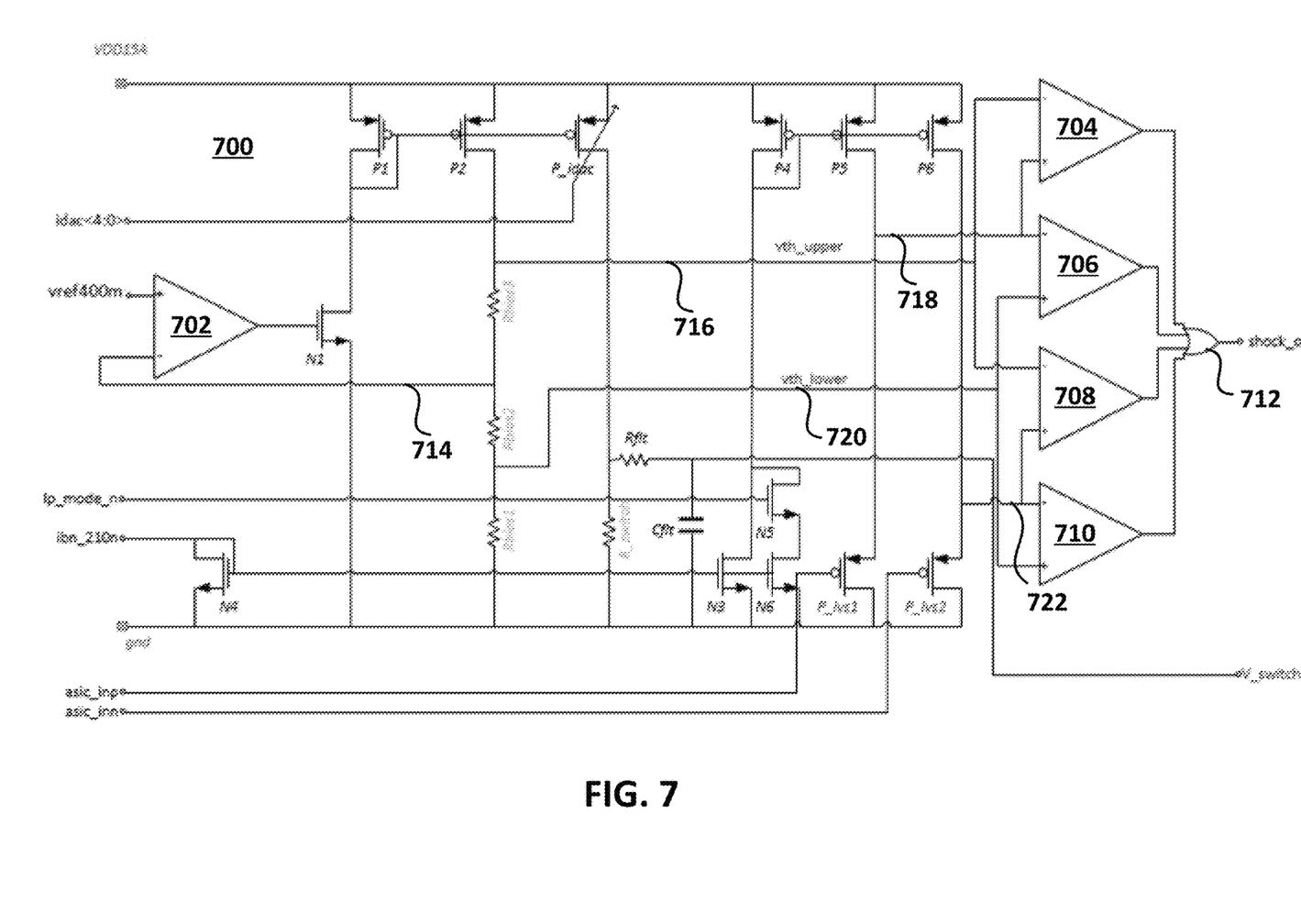
FIG. 7 is a schematic diagram of shock detector circuit, according to an embodiment.

FIG. 7 is a schematic diagram of shock detector circuit 700, according to an embodiment. In pertinent part, shock detector circuit 700 includes two input nodes asic_inp and asic_inn for receiving the analog input signals from the MEMS device, four comparators 704, 706, 708, 710, and an OR gate 712 for generating a digital shock detect output signal at node shock_0. Shock detector circuit 700 also includes biasing circuitry for biasing input transistors and creating threshold voltages. Shock detector circuit 700 also includes circuitry for generating a V_switch voltage from a DAC current for controlling switch M1, and also includes a low power input. Shock detector circuit 700 is described in further detail below.

Four separate comparators and two thresholds are used in an embodiment shock detector circuit 700, because a positive input is compared with lower and upper thresholds (which requires two comparators), and a negative input is compared with lower and upper threshold (which also requires two comparators). This circuit configuration is used to minimize mismatches in the differential configuration and to address large common mode input signals. The outputs of all of the four comparators are "ORed" to create a single digital shock detect output signal. The first threshold voltage is designated vth_upper on node 716, and the second threshold voltage is designated vth_lower on node 720. The first input to the comparators is on node 718, and the second input to the comparators is on node 722. The negative inputs of comparators 704 and 708 are coupled to node 716, the positive input of comparator 704 and the negative input of comparator 706 are coupled to node 718, the positive inputs of comparator 706 and comparator 710 are coupled to node 720, and the positive input of comparator 708 and the negative input of comparator 710 are coupled to node 722. The outputs of comparators 704, 706, 708, and 710 are coupled to the four inputs of OR gate 712 to generate the shock output signal at the shock_0 node. Node 718 is coupled to the source of an input transistor P_lvs1. The gate of transistor P_lvs1 is coupled to node asic_inp for receiving a first analog voltage from the MEMS device, and the drain of transistor P_lvs1 is coupled to ground (GND). Node 722 is coupled to the source of an input transistor P_lvs2. The gate of transistor P_lvs2 is coupled to node asic_inn for receiving a second analog voltage from the MEMS device, and the drain of transistor P_lvs1 is also coupled to ground. The current density of transistors P_lvs1 and P_lvs2 are adjusted to have the same current density as the buffer amplifier 108 shown in FIG. 1. The biasing circuitry for shock detector circuit 700 is described in further detail below.

The bias currents are generated from a bias voltage coupled to node vref400m, operational amplifier 702, transistor N1, a current mirror including transistors P1 and P2, and resistors Rbias1, Rbias2, and Rbias3. The bias voltage at node vref400m is generated by an internal reference bandgap circuit such as bandgap circuit 120 shown in FIG. 1. The positive input of operational amplifier 702 is coupled to node vref400m, the negative input of operational amplifier 702 is coupled to node 714, and the output of operational amplifier 702 is coupled to the gate of transistor N1. The drain of transistor N1 generates a bias current, which is received by the current mirror that includes transistors P1, P2, and P_idac. The source of transistor N1 is coupled to ground. The sources of the transistors in the current mirror including transistors P1, P2, and P_idac are coupled to VDD. The drain of transistor P2 is coupled to resistors Rbias1, Rbias2, and Rbias3 to generate the upper threshold voltage on node 716 and the lower threshold voltage on node 720. The output of transistor P_idac is coupled to the R_switch resistor to generate the analog control voltage for switch M1 at the V_switch node. In an embodiment, the V_switch node can be filtered by a filter including resistor Rflt and a capacitor Cflt. In an embodiment, transistor P_idac comprises five binary weighted parallel transistors (signified by the arrow through the transistor) that are selectable via Idac<4:0>. The selection (turning on or turning off) of one or more of the individual parallel transistors can be made by the use of a plurality of switches in various configurations.

Shock detector circuit 700 also receives an additional bias current at node ibn_210n, which is coupled to a current mirror comprising transistors N4, N3, and N6. The currents from transistors N3 and N6 are received by the input of a current mirror comprising transistors P4, P5, and P6. The drain of transistor P5 is coupled to the source of transistor P_lvs1 to generate the first comparator input voltage at node 718. The drain of transistor P6 is coupled to the source of transistor P_lvs2 to generate the second comparator input voltage at node 722. The output current from transistor N6 can be switched off by the action of transistor N5, whose gate is coupled to a low power mode node lp_mode_n for receiving a low power mode triggered by an internal digital state machine that will be described in further detail below.

In an embodiment, the minimum and maximum voltage rating for the VDD power supply is between −0.3 and 1.6 volts, the minimum and maximum voltage rating for the GND voltage is between −0.3 and 0.3 volts. In an embodiment, resistors Rbias, Rth_lower, R_switch, and Rth_upper can comprise matched metal resistors. It will be appreciated by those skilled in the art that the VDD, GND, and the bias and threshold voltage and currents can be set to different values and to different ranges to accommodate different semiconductor technologies and different applications. Many other biasing circuits can be used to be inputs transistors P_lvs1 and P_lvs2, and to generate the threshold voltages for comparators 704, 706, 708, and 710. In some embodiments only two comparators can be used to generate the digital shock output signal.

Figure 8:
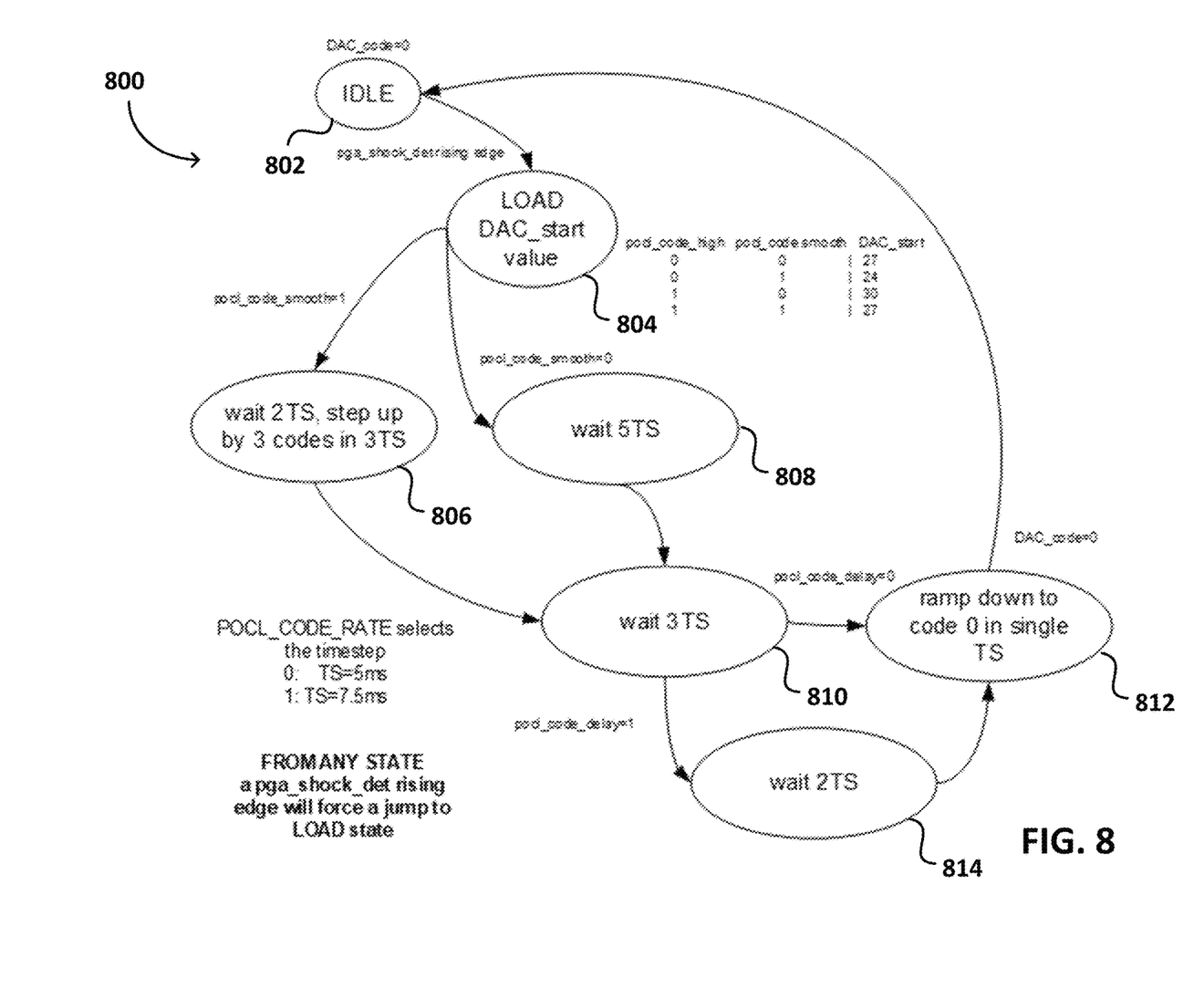
FIG. 8 is a state diagram of a recovery circuit, according to an embodiment.

FIG. 8 is a state diagram of a recovery circuit, according to an embodiment. Other example state diagrams can also be used in other embodiments. In a specific embodiment the recovery circuit comprises a state machine 800. State machine 800 can be used to implement state machine 210 shown in FIG. 2 and FIG. 9, as well as in other embodiments. For example, state machine 800 can be used to implement the waveforms 504, 506, 508, 510, and 52 shown in FIG. 5. State machine 800 starts in an idle mode in state 802, with a DAC_code=0. If a shock output signal rising edge is detected, then the state machine 800 proceeds to a LOAD state 804. In the load state 804 the DAC_start value (output of DAC 212 shown in FIG. 2) is set to a value of 27 out of 32 DAC output values. If a smooth DAC output sequence is desired pocl_code_smooth=1, and the state machine proceeds to state 806. If a smooth DAC output sequence is not desired, then pocl_code_smooth=0, and the state machine proceeds to state 808. In state 806 the initial DAC value is maintained for two timesteps, and then this value is stepped by three codes in three time steps. In state 808 the initial DAC value is maintained for five timesteps. After states 806 and 808 are completed, the state machine proceeds to data state 810. In data state 810, the current DAC value is maintained for three time steps. If no further delay is required pocl_code_delay=0 and the state machine proceeds to state 812. If a further delay is desired, pocl_code_delay=1 and the state machine proceeds to state 814. At state 814, the current DAC value is maintained for two time steps. Once data states 810 and 814 are completed, the state machine proceeds to state 812. In state 812 the DAC value is ramped down to DAC "code o" in single time steps. Once data state 812 is completed DAC_code=0, and the state machine proceeds back to initial idle mode in state 802, which means that normal operating conditions are resumed and the state machine is reset for responding to future shocks to the digital microphone.

Figure 9:
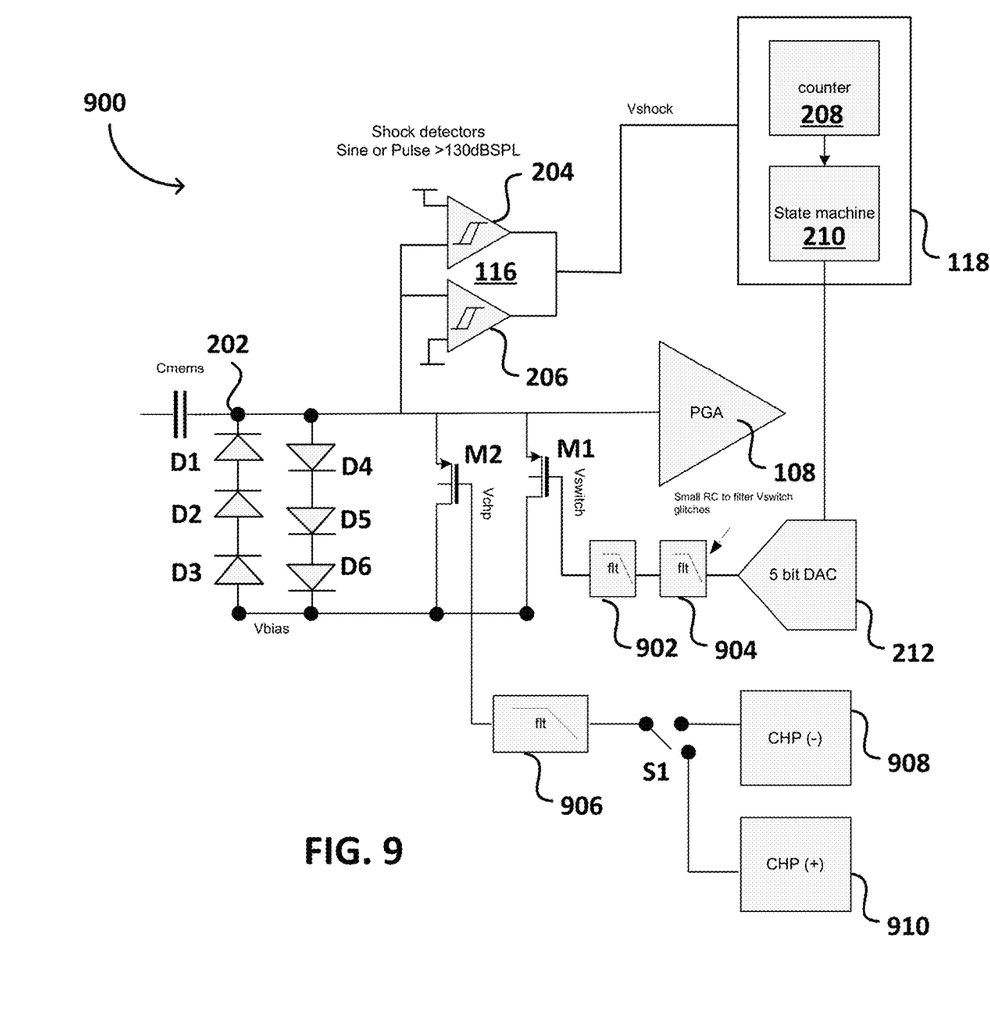
FIG. 9 is a block diagram of a shock detector and recovery circuit, according to another embodiment.

FIG. 9 is a block diagram of a digital microphone 900 comprising a shock detector 116 and a recovery circuit 118, according to another embodiment. The block diagram of digital microphone 900 is similar to the block diagram of digital microphone 200 shown in FIG. 2. In particular, digital microphone includes startup circuitry that can be reused or merged with the shock detector and recovery circuit in some embodiments. Thus, the following components are shown in FIG. 9 and have been previously described: capacitor $C_{MEMS}$, shock detector 116, recovery circuit 118, programmable gain amplifier 108, DAC 212, switch M1, and biasing circuitry D1, D2, D3, D4, D5, and D6. In addition to the previously described components, a startup circuit can comprise transistor M2, filters 902, 904, and 906, charge pump 908 and charge pump 910, as well as switch S1 in some embodiments. Low pass filters are interposed between DAC 212 and switch M1. Filter 902 and 904 are interposed between the output of DAC 212 and the gate of switch M1. Filter 904 has a smaller time constant compared to filter 902. Filter 904 is used to filter high frequency "glitches" generated by the jumps of the DAC and it is always active, whereas filter 902 has a much higher time consent and is used to filter noise coming from the supply of DAC 212 in normal operation. Filter 902 is bypassed during shock events because its time constant is relatively slow. Filter 902 is also bypassed during startup for the same reason. In some embodiments, a second switch M2 can be used to implement a startup mode of operation. The source of transistor M2 is also coupled to the input node 202, and the drain of transistor receives the $V_{BIAS}$ voltage. Transistor M2 is used to transfer a negative voltage to input node 202 from a negative charge pump 908 and/or a positive voltage to input node 202 from a positive charge pump 910. Any appropriate charge pump can be used for charge pump 908 and charge pump 910. A switch S1 selectively transfers the voltage from charge pump 908 and charge pump 910 to the gate of transistor M2. In an embodiment, switch S1 can comprise MOS transistors and inverters. Other switch embodiments can also be used. A low pass filter 906 is interposed between switch S1 and switch M2. In operation, input node is forced to a low negative voltage and/or a high positive voltage in a startup mode that occurs before normal operation of digital microphone 900 commences. Once the startup mode has been completed, switch S1 can be opened (disconnected from charge pump 908 and charge pump 910).

Figure 10:
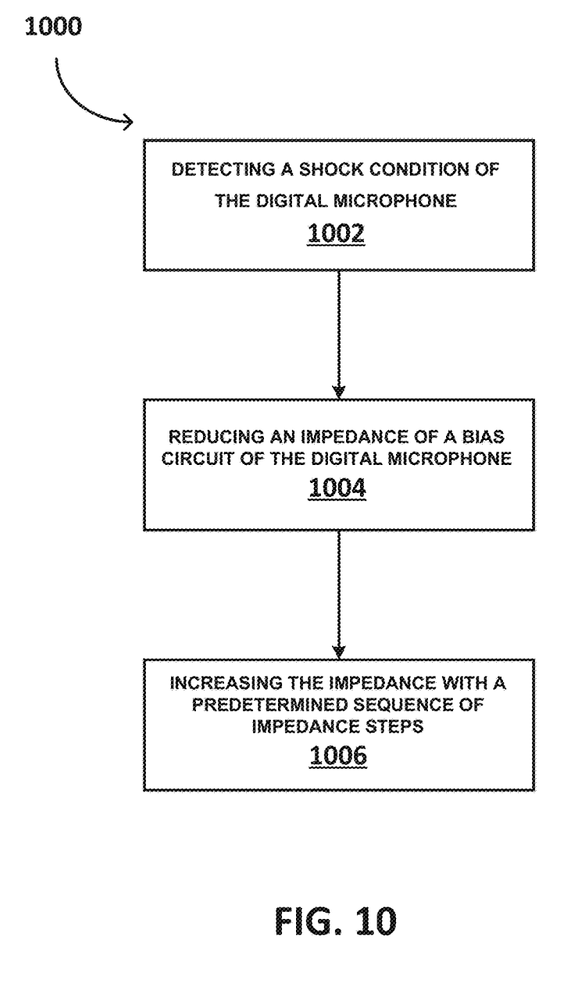
FIG. 10 is a block diagram of a shock detection and recovery method for a digital microphone, according to an embodiment.

FIG. 10 is a block diagram 1000 of a shock detection and recovery method for a digital microphone, according to an embodiment. The embodiment method comprises detecting a shock condition at the input of the digital microphone at step 1002; reducing an impedance of a bias circuit coupled to the input of the digital microphone upon detection of the shock condition 1004; and gradually increasing the impedance of the bias circuit after the shock condition terminates with a predetermined sequence of impedance steps at step 1006. In some embodiments gradually increasing the impedance of the bias circuit comprises applying the predetermined sequence of impedance steps with a range between a shocked impedance level and a normal impedance level. In some embodiments gradually increasing the impedance comprises controlling a switch coupled to the input, wherein controlling the switch comprises applying a predetermined sequence of voltage steps to a gate of the switch, and wherein the predetermined sequence of voltage steps is provided by a digital-to-analog converter (DAC). In some embodiments detecting the shock condition comprises comparing a voltage of the input to first and second threshold voltages.

While reference has been made herein to a digital microphone, the shock detector and recovery circuit described herein can be used in a conventional analog microphone having a high input impedance to restore normal biasing conditions after a shock event in an embodiment.

Example embodiments of the present invention are summarized here. Other embodiments can also be understood from the entirety of the specification and the claims filed herein.

Example 1. According to an embodiment, a microphone includes an amplifier coupled to an input node of the microphone; a shock detector coupled to the input node of the microphone; and a recovery circuit having an input coupled to an output of the shock detector, and an output coupled to the input of the microphone.

Example 2. The microphone of Example 1, wherein the shock detector includes a plurality of comparators.

Example 3. The microphone of any of the above examples, wherein the recovery circuit includes a digital-to-analog converter (DAC); and a switch having a control node coupled to an output of the DAC.

Example 4. The microphone of any of the above examples, wherein the recovery circuit further includes a counter and a state machine.

Example 5. The microphone of any of the above examples, wherein a controlled node of the switch is configured for supplying a plurality of impedance steps to the input node of the microphone.

Example 6. The microphone of any of the above examples, wherein a plurality of voltage steps at the control node of the switch is configured to have a range between a shocked bias level and a normal bias level.

Example 7. The microphone of any of the above examples, further including an additional switch coupled to the input node of the microphone, wherein the additional switch is configured for implementing a startup mode of operation.

Example 8. According to an embodiment, a circuit includes a shock detector coupled to an input node; and a recovery circuit coupled to an output of the shock detector, wherein the recovery circuit is configured for lowering an impedance of the input node after a shock, and then gradually increasing the impedance of the input node.

Example 9. The circuit of Example 8, wherein the shock detector includes a first comparator having a first threshold voltage, and a second comparator having a second threshold voltage.

Example 10. The circuit of any of the above examples, wherein the recovery circuit includes a digital-to-analog converter (DAC) coupled to an output of the recovery circuit; and a switch having a control node coupled to an output of the DAC, and a controlled node coupled to an output of the recovery circuit.

Example 11. The circuit of any of the above examples, wherein the recovery circuit further includes a counter and a state machine.

Example 12. The circuit of any of the above examples, wherein the controlled node of the switch is configured for supplying a plurality of sequentially increased impedance steps to the input node.

Example 13. The circuit of any of the above examples, wherein the sequentially increased impedance steps are configured to have a range between a shocked bias level and a normal bias level.

Example 14. The circuit of any of the above examples, wherein the switch is coupled between the input node and a bias voltage source.

Example 15. According to an embodiment, a method of operating a microphone includes detecting a shock condition at an input of the microphone; reducing an impedance of a bias circuit coupled to the input of the microphone upon detection of the shock condition; and gradually increasing the impedance of the bias circuit.

Example 16. The method of Example 15, wherein the impedance of the bias circuit is gradually increased after the shock condition terminates.

Example 17. The method of any of the above examples, wherein the impedance of the bias circuit is gradually increased with a predetermined sequence of impedance steps.

Example 18. The method of any of the above examples, wherein gradually increasing the impedance includes controlling a switch coupled to the input.

Example 19. The method of any of the above examples, wherein controlling the switch includes applying a predetermined sequence of voltage steps to a gate of the switch.

Example 20. The method of any of the above examples, wherein the predetermined sequence of voltage steps is provided by a digital-to-analog converter (DAC).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microphone comprising:
   an amplifier coupled to an input node of the microphone;
   a shock detector coupled to the input node of the microphone; and
   a recovery circuit having an input coupled to an output of the shock detector, and an output coupled to the input node of the microphone, wherein the recovery circuit comprises a digital-to-analog converter (DAC); and a switch having a control node coupled to an output of the DAC.

2. The microphone of claim 1, wherein the shock detector comprises a plurality of comparators.

3. The microphone of claim 1, wherein the recovery circuit further comprises a counter and a state machine.

4. The microphone of claim 1, wherein a controlled node of the switch is configured for supplying a plurality of impedance steps to the input node of the microphone.

5. The microphone of claim 1, wherein a plurality of voltage steps at the control node of the switch is configured to have a range between a shocked bias level and a normal bias level.

6. The microphone of claim 1, further comprising an additional switch coupled to the input node of the microphone, wherein the additional switch is configured for implementing a startup mode of operation.

7. A circuit comprising:
   a shock detector coupled to an input node; and
   a recovery circuit coupled to an output of the shock detector, wherein the recovery circuit, in response to a shock detected by the shock detector, is configured for lowering an impedance of the input node after the shock, and then gradually increasing the impedance of the input node.

8. The circuit of claim 7, wherein the shock detector comprises a first comparator having a first threshold voltage, and a second comparator having a second threshold voltage.

9. The circuit of claim 7, wherein the recovery circuit comprises:
  a digital-to-analog converter (DAC) coupled to an output of the recovery circuit; and
  a switch having a control node coupled to an output of the DAC, and a controlled node coupled to an output of the recovery circuit.

10. The circuit of claim 9, wherein the recovery circuit further comprises a counter and a state machine.

11. The circuit of claim 9, wherein the controlled node of the switch is configured for supplying a plurality of sequentially increased impedance steps to the input node.

12. The circuit of claim 11, wherein the sequentially increased impedance steps are configured to have a range between a shocked bias level and a normal bias level.

13. The circuit of claim 9, wherein the switch is coupled between the input node and a bias voltage source.

14. A method of operating a microphone, the method comprising:
  detecting a shock condition at an input of the microphone;
  reducing an impedance of a bias circuit coupled to the input of the microphone upon detection of the shock condition; and
  gradually increasing the impedance of the bias circuit.

15. The method of claim 14, wherein the impedance of the bias circuit is gradually increased after the shock condition terminates.

16. The method of claim 14, wherein the impedance of the bias circuit is gradually increased with a predetermined sequence of impedance steps.

17. The method of claim 14, wherein gradually increasing the impedance comprises controlling a switch coupled to the input.

18. The method of claim 17, wherein controlling the switch comprises applying a predetermined sequence of voltage steps to a gate of the switch.

19. The method of claim 18, wherein the predetermined sequence of voltage steps is provided by a digital-to-analog converter (DAC).

* * * * *